United States Patent [19]

Matsumura et al.

[11] Patent Number: 4,680,377

[45] Date of Patent: Jul. 14, 1987

[54] POLYIMIDE PREPOLYMER COMPOSITION FROM UNSATURATED BISIMIDE AND DIAMINE CONTAINING UNREACTED REACTANTS

[75] Inventors: Masahiro Matsumura; Kenzi Ogasawara; Atsuhiro Nakamoto; Yoshihisa Sugawa, all of Kadoma, Japan

[73] Assignee: Matsushita Electric Works, Ltd., Osaka, Japan

[21] Appl. No.: 805,989

[22] Filed: Dec. 5, 1985

[30] Foreign Application Priority Data

Jan. 15, 1985 [JP] Japan .................................. 60-4600

[51] Int. Cl.$^4$ ........................ C08G 73/10; C08G 73/12
[52] U.S. Cl. .................................. 528/322; 156/327; 156/330.9; 156/331.1; 156/331.5; 528/170; 528/321
[58] Field of Search .............................. 528/322, 170

[56] References Cited

U.S. PATENT DOCUMENTS 3,562,223  2/1971  Bargain et al. .................. 260/78
3,658,764  4/1972  Bargain et al. .................. 260/78

*Primary Examiner*—Harold D. Anderson
*Attorney, Agent, or Firm*—Koda and Androlia

[57] ABSTRACT

Superior polyimide prepolymers particularly suitable for fabrication of multi-layer printed boards are produced by reacting unsaturated bisimides with diamines to consist essentially of 41–55% of unreacted reactants, 39–54% of components having a molecular weight of between 400 and 15,000, and 3.0–6.8% of components having a molecular weight of more than 15,000. The resulting prepolymers enable the preparation of their solution having enough working life for successfully impregnating a given substrate therewith in the preparation of prepregs. The prepregs, prepared from the above prepolymers in such a way as to contain within the resin content thereof 29–35% of unreacted reactants, 51–65% of the components having a molecular weight of between 400 and 15,000, and 5–14% of the components having a molecular weight of more than 15,000, allow the fabrication of laminate products with remarkable dimension stability under a low molding pressure to eliminate the presence of voids in the products, in addition to that the prepregs ensure a high bond strength as well as elongated working life which is responsible for prevention of a blister in the finished laminate and for easy control of the laminate forming process.

3 Claims, No Drawings

POLYIMIDE PREPOLYMER COMPOSITION FROM UNSATURATED BISIMIDE AND DIAMINE CONTAINING UNREACTED REACTANTS

BACKGROUND OF THE INVENTION

1. Field of the Invention

The present invention is directed to polyimide prepolymers of the addition reacted type and prepregs obtained therefrom as well as to a method of producing laminates by the use of said prepregs, more particularly to such compositions and method suitable for fabricating multi-layer printed circuit boards.

2. Description of the Prior Art

In the field of fabricating printed circuit boards of a fewer number of layers, there have been widely utilized a various epoxy resins having valuable properties including superior adhesive properties, remarkable resistance to chemical agents, high mechanical strength, and excellent dielectric properties. However, the epoxy resins are found to be no longer appropriate for fabricating multi-layer printed boards in use for constructing high density circuits and modules, since they do not always assure enough resistance to heat which is applied repeatedly to such printed boards for module mounting purposes, in addition to that they frequently reduce reliability in conductivity of conductor layers thereof due to possible resin smear or heat expansion in the direction of thickness of the board. To settle the above problems, heat-stable polyimide resins are presently utilized and found to be satisfactory for the fabrication of the multi-layer printed boards. Particularly, polyimide resins of addition reacted type obtained by reacting unsaturated bisimides with diamines are most acceptable for fabricating the multi-layer printed boards, because the use of that material gives rise to remarkable and advantageous features. Included in the above advantageous features expected by the use of that material are to allow the formation of fine conductive paths as well as the drilling operation of minute holes with high accuracy, which are indispensable for high density circuit arrangement; to keep the heat expansion in the direction of thickness at a minimum for providing increased reliability of conductivity at plated throughholes; to eliminate the deposition of resin smear during drilling operation; to give increased bond strength to the conductor layers as well as increased hardness to the bases of the printed board at elevated temperatures for improving module mounting performance; and to well withstand the continuous operation at an elevated temperature of about 200° C.

Such polyimide prepolymers with valuable characteristics have been disclosed in U.S. Pat. No. 3,562,223 granted to Michel Bargain et al, and have been taught therein to be obtained by reacting unsaturated bisimides with diamines.

In the meanwhile, today's increasing miniaturization of large-scaled computers has resulted in the utilization of multi-layer printed boards with high mounting density, which should require much finer circuit pattern arrangement and much more minute through hole drilling. Consequently, the printed boards to be employed for that purpose should have a higher level of dimension stability as well as superior adhesive property. That is, possible variance in the dimensions of boards can seriously affect interlayer or interplane registration. Thus, the dimensional variance should be kept at a minimum and this is particularly important for fabricating the multilayer boards of larger dimensions. Accordingly, the printed boards are preferred to be molded at such a low pressure level as not to lower the dimensional stability. But, there still remains a problem that the molding at such low pressure level may sometimes fail to successfully flow the resin uniformly throughout the boards being cured or fail to eliminate all traces of solvent employed for an impregnation purpose and therefore result in the presence of unacceptable voids in the molded printed boards. With regard to the adhesive property, the formation of high density circuits requires a correspondingly high bond strength not only between the conductor layer and the resin composition but also between the resin composition and the substrate or base material of the board, otherwise minute peels would occur at the interlayer between the cured resin and the base material during the minute hole drilling, such peels being unacceptable and should be of course eliminated.

In view of the above, the multi-layer printed boards for use in the large-scale computers are desired to combine much higher bond strength with much superior dimensional stability. In other words, prepolymers and the prepregs made therefrom used for fabrication of the multi-layer printed boards should exhibit much higher bond strength and as well enable the molding of the boards at such a low pressure level as not to reduce the dimension stability yet without causing any defective void in the resulting boards.

The prior polyimide prepolymers including those disclosed in the above U.S. patent are known to exhibit excellent bond strength together with other remarkable features, but unfortunately are found to be still unsatisfactory for the fabrication of the multi-layer printed board of the type having a larger number of layers which require a higher level of dimension stability and superior adhesive property. That is, the prior polyimide prepolymers are likely to suffer insufficient bond strength when fabricating such multi-layer printed boards and further to cause defective voids when molded at a low pressure in an attempt to ensure the dimension stability.

The investigation into the above unsatisfactory results with the use of prior polyimide prepolymers has revealed that macromolecular components with a molecular weight of more than 15,000 contained in a greater amount may account for the above insufficient bond strength and the occurrence of the voids at the low pressure molding. In fact, the components with a molecular weight of more than 15,000 have inherent high viscosity which requires a more amount of solvent for impregnation purposes and therefore provides more chance of the residual solvent being entrapped in the printed board at the time of low pressure molding, thus leaving the defective voids in the boards. Also characteristic to the above macromolecular components is less sensitivity with a cooperative substrate with which it is in contact for bond therebetween, such lowered sensitivity or activity will be the cause of failing to achieve integral bonding with the substrate, resulting in less bond strength therebetween. As suggested from the above consideration, polyimide prepolymers for the present purpose are expected to contain less amount of the macromolecular components having a molecular weight of exceeding 15,000 than the prior prepolymers. Conversely, prepolymers containing more amount of components with a molecular weight of less than 15,000 are expected to be preferable. With this in mind, the inventors have further studied the adaptability of the polyimide prepolymers to the fabrication of the multi-layer printed boards and other laminate products and found that polyimide prepolymers containing specific proportions of components with a specific range of molecular weight with respect to the other components in the prepolymer composition are responsible for providing satisfactory properties for the fabrication of the multi-layer printed circuit.

To this end, the applicant of the present invention have proposed in their U.S. patent application Ser. No. 715,001 useful prepolymers and prepregs prepared therefrom. However, further investigation into such prepolymers and prepregs reveals that they are still insufficient for practical application purposes. That is, although the prepolymers and prepregs disclosed in the above application have been found to be advantageous in many aspects, the solution of the prepolymers and the prepregs will have a relatively working life, or they will become solidified rapidly so as not to afford enough curing time during which a volatile solvent being used is required to evaporate successfully from the prepreg solutions or the prepregs. Without enough curing time, the solvent is likely to be entrapped in the finished products or laminates when the resin composition is entirely solidified, rendering the cured resin to have defective voids caused by evaporation of the residual solvent. Such voids will certainly lower the bond strength expected by the cured resin and further be the cause of a blister in the finished laminates. Consequently, the prepolymers and the prepregs are mostly desired to have a longer curing time during which the solvent is allowed to successfully evaporated before the resin composition is finally cured.

SUMMARY OF THE INVENTION

The present invention is an improvement of the above listed patent application by the same applicant and has its primary object to present novel polyimide prepolymers and prepregs with improved adhesion and void-free characteristics under retention of the advantages of the above patent application in use for fabricating laminate products or the multi-layer printed circuit boards of excellent dimension stability.

Another object of the present invention is to provide a method of successfully producing laminates of the printed boards.

The polyimide prepolymers of the present invention are of addition reacted type obtained by reacting an unsaturated bisimide with a diamine and consist essentially of about 41–55% of unreacted reactants, 39–54% of components having a molecular weight of between 400 and 15,000, and 3.0–6.8% of components having a molecular weight of more than 15,000.

The above unsaturated bisimides and diamines are represented respectively by the following general Formulas I and II:

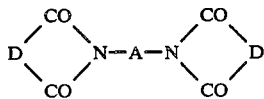
(I)

in which D represents a divalent radical containing a carbon-carbon double bond and A is a divalent radical having at least 2 carbon atoms.

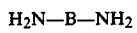 (II)

in which B represents a divalent radical not having more than 30 carbon atoms.

The symbols A and B may be identical or different and may represent linear or branched alkylene radicals having less than 13 carbon atoms, cycloalkylene radicals having 5 to 6 carbon atoms in the ring, heterocyclic radicals containing at least one of the atoms O, N and S, or a phenylene or polycyclic aromatic radical. These various radicals may carry substituents which do not give undesired side-reactions under the operating conditions. The symbols A and B may also represent a number of phenylene or alicyclic radicals connected directly or by a divalent atom or group such as, for example, oxygen or sulfur, an alkylene grouping of 1 to 3 carbon atoms, or one of the groups

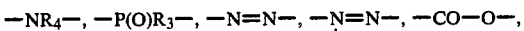
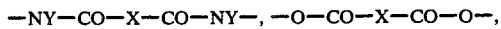

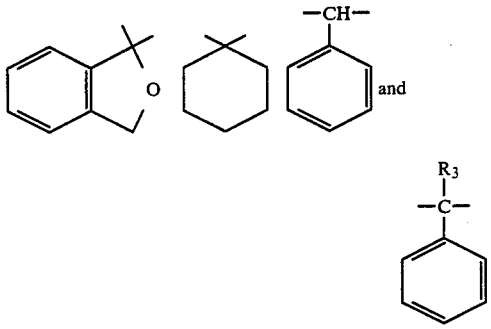 and in which $R_3$, $R_4$ and Y each represent alkyl of 1 to 4 carbon atoms, or a cycloalkyl radical having 5 or 6 carbon atoms in the ring, or a phenyl or polycyclic aromatic radical, and X represents a straight or branched alkylene radical having less than 13 carbon atoms, a cycloalkylene radical having 5 or 6 carbon atoms in the ring, or a mono- or polycyclic arylene radical.

The radical D is derived from an ethylenic anhydride of the formula:

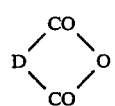 (III)

which may be, for example, maleic anhydride, citraconic anhydride, tetrahydrophthalic anhydride, itaconic anhydride and the products of Diels-Alder reaction between a cyclodiene and one of these anhydrides.

Preferred unsaturated bisimides of Formula I which may be employed, are maleic N,N'-ethylene-bisimide, maleic N,N'-hexamethylene-bisimide, maleic N,N'-metaphenylene-bisimide, maleic N,N'-paraphenylene-bisimide, maleic N,N'-4,4'-diphenylmethane-bisimide [also referred to as N,N'-methylene-bis(N-phenylmaleimide)], maleic N,N'-4,4'-diphenylether-bisimide, maleic N,N'-4,4'-diphenylsulphone-bisimide, maleic N,N'-4,4'-dicyclohexylmethane-bisimide, maleic N,N'-α,α'-4,4'- dimethylenecyclohexane-bisimide, maleic N,N'-metaxylylene-bisimide, and maleic N,N''-diphenylcyclohexane-bisimide.

Examples of diamines of Formula II which may be employed, are
4,4'-diaminodicyclohexylmethane, 1,4'-diaminocyclohexane,
2,6-diaminopyridine,
metaphenylenediamine, paraphenylenediamine,
4,4'-diamino-diphenylmethane,
2,2-bis-(4-aminophenyl)-propane, benzidine,
4,4'-diaminophenyl oxide,
4,4'-diaminodiphenyl sulphide,
4,4'-diaminodiphenyl-sulphone,
bis-(4-aminophenyl)diphenylsilane,
bis-(4-aminophenyl)methylphosphine oxide,
bis-(3-aminophenyl)methylphosphine oxide,
bis-(4-aminophenyl)phenylphosphine oxide,
bis-(4-aminophenyl)phenylamine, 1,5-diaminonaphthalene,
metaxylylenediamine, paraxylylene diamine,
1,1-bis-(paraaminophenyl)phthalene, and
hexamethylenediamine.

The proportions of the individual components and unreacted reactants are based on the proportion of the peak areas determined with reference to known calibration curves indicating the relationship between molecular weight and the retention time obtained in a chromatography, the details of which will be discussed hereinafter. The proportion of the unreacted reactants, or unsaturated bisimides and the diamines, contained in the prepolymer composition may be the indication of reaction progress, and indicates when below 41% that the reaction has proceed excessively so as to produce more amounts of the undesirable components having a molecular weight of more than 15,000 to an unacceptably greater extent that the resin composition will be cured rapidly upon being subjected to a drying treatment in the subsequent process of preparing prepregs from the prepolymer composition, thus reducing the drying time and therefore the working life. With this reduced working life, it is practically difficult to subject the prepregs to the drying treatment in a longer time enough for successively evaporating a volatile solvent employed in preparing the solution of the prepolymer composition. Consequently, the solvent remaining in the prepregs will certainly act to weaken the adhesive strength to the substrate of the prepreg. When on the other hand, the proportion of the unreacted reactants exceeds 55%, the reaction has not proceeded enough for producing a suitable amount of prepolymerized components which are necessary for preparing a prepreg of proper resin content. That is, without a suitable amount of the prepolymerized components being produced, the whole composition sees short of solubility when dissolved in a solvent or polar diluent such as N-methylpyrolidone or dimethylacetamide at the time of preparing prepolymer solution. Thus, the prepolymer solution is likely to suffer precipitation. Accordingly, the proportion of the unreacted reactants is found to be between 41 and 55%.

The components having a molecular weight of between 400 and 15,000 are found to exhibit satisfactory properties suitable for fabrication of laminate products or said multi-layer printed boards, that is, to have remarkable adhesive property as well as to form a solution of suitable viscosity when dissolved in the solvent whereby the substrate can be impregnated with the solution in such a way as to allow a low pressure molding without causing any defective voids in the resulting molded laminates or printed boards. In this respect, the components having the molecular weight of between 400 and 15,000 are assumed to be preferably included in as much an amount as possible within the prepolymer compositions, but excess amount of such components being produced means that the reaction process advances correspondingly further and accordingly results in an increased amount of said undesirable macromolecular components having a molecular weight of more than 15,000 being produced, which components should be kept in a minimum amount for the reason described above. From this view point, the proportion of components with a molecular weight of between 400 and 15,000 is preferred not to exceed 54% since the working life is reduced with the increased amount of macromolecular components when that proportion exceeds 54%. The lower limit for the amount of the above components is found to be 39%, if below 39%, more of the reactants would remain unreacted so that the prepolymers composition would suffer the afore-said inconveniences such as the occurrence of precipitation when dissolved in the solvent.

The components having a molecular weight of more than 15,000, when produced in a larger amount, will correspondingly reduce the working life and adhesive strength with the substrate, as discussed in the above. Accordingly, such macromolecular components are preferred to be retained at a minimum amount. However, the prepolymerization process cannot take place without producing such components having the macromolecular weights, that is, such components can be produced immediately after the initiation of the prepolymerization reaction. In consideration of the above, the amount of that components is preferred to be limited between 3.0 and 6.8%. Below 3.0%, the prepolymerization process would not proceed enough such that the resulting prepolymer composition suffers the lack of viscosity when dissolved in the solvent to thereby fail to provide prepregs of a suitable resin content. Above 6.8%, on the contrary, the prepolymer composition would contain more amount of said undesirable macromolecular components so as to cause the solution of the prepolymer to have too high viscosity, which is not acceptable for effecting the low pressure molding without accompanied by any defective voids, as stated previously.

In connection with the above, the inventors have sampled the components having a molecular weight of exceeding 50,000, which are thought to be well representative of the nature for the above macromolecular components, and analyzed the same. The sampled components were dissolved in d-DMF (deuterated dimethylformamide) and analyzed by a nuclear magnetic resonance spectrometer. The analysis revealed that the above components hardly contains diamine and consist essentially of the polymerized products only from the bisimides, which products are known to show less elasticity and less adhesion property. This confirms that the amount of the macromolecular components should be kept at a minimum.

In the present invention, the determination of molecular weight distributions of the prepolymers and the prepregs being obtained relies upon a Gel Permeation Chromatography (GPC) analysis by means of a chromatography apparatus HLC-803D (manufactured by Toyo Soda Manufacturing Co., Ltd.) connected to a pair of 8.0 mm in diameter×250 mm in length chromatographic columns AD-803/S (manufactured by Showa Denko K.K., Japan) packed with divinylbenzene-styrene copolymer having particle sizes in the order of micron. Dimethylformamide (DMF) was employed as a dilute solvent. Each column has theoretical plate counts of 6000 so that the above column system has an efficiency of 12000 theoretical plate counts. A sample of 100 μl of a solution having a polymer content of 0.5±0.2 wt% (resin content / DMF+solvent contained in prepolymer or prepreg) was injected into the column as maintaining an eluent flow rate at 1.0±0.01 ml/min. A differential refractometer ($128 \times 10^{-8}$ RI units) was used in combination with a recorder having a chart speed of 5 mm/min to provide on a record paper of uniform density throughout its area a waveform chart indicating the eluate concentration. The refractometer was adjusted to have an output range of between 0-1 V for matching with a selected input range of 0-10 mV of the recorder. Reference samples employed for determination of the molecular weights were five kinds of monodispersed polyethylene glycols with molecular weights of 20,000, 10,000, 6000, 4000, and 400 plus ethylene glycol monomer with molecular weights of 62. The calculations of molecular weights were based upon a regression curve of cubic equation or a calibration curve which has been obtained with respect to each of the above reference samples to give a relationship between the known retention time and its associated molecular weight, such that the molecular weights of the sample can be determined by applying corresponding retention time to one of the existing regression curves. The determination of said molecular weight distribution or respective proportions expressed in percentage of the constituents with different molecular weights to the whole resin content of the sample was conducted by a so-called cut-and-weighing method in which the record paper of uniform density marked with the GPC trace or chromatogram of the sample was cut into fractions each representing the amount of particular components with a specific range of molecular weight, and each fraction was weighed for determination of its proportion to the total of fractions weighed. Prior to determination of the above proportions, index molecular weights were selected to be 15,000 and those representative of unreacted reactants remaining in the sample prepolymer or prepreg, to each molecular weight of which a corresponding retention time was obtained from the above calibration curves. Then, the GPC trace chart was cut into a corresponding number of fractions of areas below the curve of the GPC trace between the particular retention times representative of the above molecular weights. Each of the fractions was weighed exactly for obtaining its proportion to the whole, which proportion indicates the ratio of peak area and may approximate the proportion in weight of the particular components to the whole resin content of the prepolymer or prepreg.

Alternatively, an integrator may be employed for easy calculation of the above fractions by divisional quadracture, in which case each fraction of the chromatogram should be required to be divided into at least 200 step sections for reliable calculation.

The unreacted reactants remaining in the above prepolymer composition are preferred to be kept at a molar ratio of bisimide to diamine of from 1.7 to 2.5. This is because that if the ratio is more than 2.5 the resulting prepolymer composition when forming a solution or prepreg of suitable resin content would disadvantageously causes the precipitation of unreacted components, particularly of unsaturated bisimide during its storage and that if the ratio is less than 1.7 the time required for curing the resulting prepolymer in the subsequent operation of forming the prepregs and/or making the laminates would be considerably reduced to such an extent as to complicate the control of such curing operation.

In fact, the prepolymer solutions of the present invention in which the unreacted reactants are kept at the molar ratio of bisimide to diamine of between 1.7 and 2.5, are found to cause substantially no precipitation not only during the normal storage condition at room temperature but also during cold storage condition at a temperature of −5° C.

The above molar ratio of the unreacted reactants was calculated from the numbers of moles determined by the following method. That is, the prepolymer was dissolved in acetonitrile for selectively dissolving the unreacted reactants therein and then the constituents dissolved in acetonitrile was analyzed to quantitatively determine the reactants for calculating the number of moles thereof by liquid chromatography using reverse-phase partition column LS-120T (manufactured by Toyo Soda Manufacturing Co., Ltd.) and using acetonitrile-water as a diluent. Prior to the above operation, a calibration curve with respect to each of the reactants had been obtained for indicating the relationship between the mole number and the peak area, and the calculations of the mole numbers of the respective reactants were made by applying the measured peak value to the corresponding calibration curves. Also prior to the above determination, the constituents insoluble in acetonitrile and therefore still remaining in the prepolymer had been diluted in DMF for analysis thereof by gel-permeation chromatography, which did not show any peak indicating the presence of the unreacted reactants and accordingly confirmed that the unreacted reactants had been entirely dissolved in acetonitrile and extracted therewith.

The prepolymer composition of the addition reacted type prepared in accordance with the present invention to have the above specific component proportion is found to exhibit superior bond strength with the substrate as well as outstanding resistance to heat, in contrast to that no prior prepolymer compositions were found to be available with the specific component proportion. In fact, the examination of the commercially available prepolymers showed that they contained much more amount of the components with a molecular weight of more than 15,000, as compared to the prepolymer composition of the present invention.

The prepolymer composition of the present invention can be prepared by reacting unsaturated bisimides with diamines in a polar diluent at a relatively low temperature of below 95° C., preferably at a temperature of between 60° and 95° C. While on the other hand, prior process of preparing the polyimide prepolymers at an elevated temperature of between 120° and 200° C. either in the melt or in solution was found to normally accelerate the prepolymerization reaction speed to such an extent that excess amount of the macromolecular components with a molecular weight of more than 15000 were produced although the amount of unreacted reactants were effectively reduced. Also, in an attempt of controlling the prepolymerization process in such a way as to produce the macromolecular components with a molecular weight of more than 15,000 at an optimum proportion of between 3.0 and 6.8%, the prepolymerization reaction at that elevated temperature of between 120° and 200° C. was found to lead to insufficient reaction process and therefore result in unnecessarily increased amount of the unreacted reactants remaining in the resulting prepolymer composition. This trend of leaving the reactants unreacted in more amount will be more prominent when the prepolymerization reaction is carried out in melts at a higher temperature. Further, with this prepolymerization reaction in melts there were produced an excess amount of the macromolecular components with a molecular weight of more than 15,000 in addition to the unreacted reactants produced in excess amount, thus resulting in the extreme shortage of the component with a molecular weight of between 400 and 15,000, which are the effective components for preparation of the prepregs and fabrication of the final laminate products, as explained hereinbefore.

The above prepolymerization reaction, which is carried out in solution at a lowered temperature of between 60° and 95° C. for preparing the polyimide prepolymer of the present invention, normally require 1 to 10 hours, however, the exact reaction time will vary depending upon the selection of particular reactants, polar diluent, concentration of the solution, and reaction temperature and therefore may deviate from the above range in some conditions.

The molar ratio of unsaturated bisimide to diamine of the present prepolymer is preferably set between 1.7 and 2.5 in view of the fact that when it is below 1.7 components having a macromolecular weight are produced in a greater amount and at the same time the curing time is considerable shortened to such an extent as to complicate the handling or controlling of the reaction process. When it is above 2.5, on the other hand, the reactant, particularly unsaturated bisimide remain unreacted and contained in more amount in the resulting prepolymer composition, whereby the unsaturated bisimide is liable to be precipitated during the storage of the prepolymer solution. The above molar ratio was determined for the final solution of the prepolymer composition, and therefore, both or either of the reactants may be added at intervals in the course of prepolymerization process or the fraction thereof may be added after the completion of the process as necessary.

The novel prepreg also provided in the present invention was obtained by impregnating a suitable substrate with the solution of the polyimide prepolymer of the addition reacted type prepared in the above, by partially or semi-curing of the prepolymer to evaporate the solvent thereof in such a way that the resin content thereof consists of 29–35% of the unreacted reactants, 51–65% of the components having a molecular weight of between 400 and 15,000, and 5–14% of the components having a molecular weight of more than 15,000. The prepreg of this specific component proportion can be only made from the above polyimide prepolymer composition of the present invention and can only assure the successful molding of destined laminate products at a low pressure level without causing voids in the final laminate products. When the proportion of the unreacted reactants are reduced to be less than 29%, that of the components with a molecular weight of between 400 and 15,000 exceeds 65%, and that of the components with a molecular weight of more than 15,000 exceeds 14%, the latter macromolecular components are to be predominant so as to unduly increase the viscosity of the resin, which would certainly bring about the voids in the laminates when fabricated by a low pressure molding. Also with the above condition, the subsequent curing for the fabrication of the laminates would be completed in too short time as to providing successful fabrication of laminates of larger dimensions. Also, when the proportion of the unreacted reactants is above 35%, that of the components with a molecular weight of between 400 and 15,000 is less than 51%, and that of the components with a molecular weight of more than 15,000 is less than 5%, the solvent is liable to remain in more amount in the prepreg, which remaining solvent being responsible to be the cause of defective blisters in the final laminate products. The components with a molecular weight of more than 15,000 are preferably retained in a minimum amount by the same reason as discussed with respect to the prepolymer composition.

As noted hereinbefore, the commercially available prepolymers contain more amounts of the components with a molecular weight of exceeding 15,000 than the prepolymer composition of the present invention and consequently cannot provide the prepreg having the above specific component proportions no matter how the curing condition might be chosen.

The substrate employable for the preparation of the prepreg includes glass cloth, inorganic fabrics such as made of quarts fibers and other heat resistant fabrics such as Keblar, DuPont fabric.

The above semi-curing operation for preparation of the prepreg may be preferably carried out at a temperature of 130° to 155° C. since the reaction process is to be accelerated to produce a more amount of undesirable macromolecular components at an elevated temperature of above 155° C. and the prepreg cannot be made in an effective manner at a temperature below 130° C.

Said laminate products can be fabricated by laying up any number of the prepreg sheets as is necessary in combination with a foil such as made of copper and nickel, or an internal layers finished with a circuit pattern. Due to the superior property of the above prepreg that it allows the fabrication of the laminate products measuring 50 cm×50 cm and more greater planar dimensions only at a low pressure level of less than 15 kg/cm$^2$ without causing any void in the resulting laminate products, which is opposed to that the commercially available prepregs should require a higher pressure level of more than 40 kg/cm$^2$ for eliminating the void. Thus, the laminate products fabricated in accordance with the present invention will exhibit highly dimensional stability, in addition to that they enjoy superior adhesive property associated with the above prepolymer composition of the invention. Accordingly, the laminate products of the present invention can be suitable for fabrication of multi-layer printed boards requiring a highly dense circuit and module arrangement.

DESCRIPTION OF THE PREFERRED EMBODIMENTS

The following Examples will serve to further illustrate the present invention.

EXAMPLES

Tables 1 and 2 include Examples 1 to 6 which are representative of the prepolymer compositions of the present invention and includes Comparative Examples 1 to 5 which are included for comparison purposes. The Comparative Example 6 corresponds to commercially available polyamino bismaleimide prepolymer sold under the tradename of Kelimide 601 by Rhone-Poulenc, France.

prepolymer solution of advantageous component proportions specific to the present invention, the reasons of which are thought to result from the improper combina-

TABLE 1

| Proportion of Agents (g) and Conditions | Example No. | | | | | | Comparative Example No. | | | | |
|---|---|---|---|---|---|---|---|---|---|---|---|
| | 1 | 2 | 3 | 4 | 5 | 6 | 1 | 2 | 3 | 4 | 5 |
| N,N'—methylene-bis(N—phenyl-maleimide) *1 | 523 | 306 | 506 | 657 | 384 | 539 | 940 | 828 | 983 | 522 | 474 |
| N,N'—methylen-bis(N—phenyl-maleimide) (to be added later) | 475 | 612 | 373 | 303 | 663 | 490 | — | 83 | — | 475 | 612 |
| 4,4'-diamino-diphenyl-methane *2 | 263 | 282 | 206 | 280 | 193 | 271 | 260 | 229 | 217 | 263 | 154 |
| N—methyl-pyrrolidone | 740 | 800 | 860 | 760 | — | — | 800 | 860 | — | 740 | — |
| N,N—dimethyl-acetoamide | — | — | — | — | 760 | 700 | — | — | 800 | — | 760 |
| Reaction temperature (°C.) | 80 | 70 | 90 | 80 | 75 | 80 | 80 | 90 | 95 | 80 | 80 |
| Reaction Time (minute) | 160 | 140 | 90 | 200 | 150 | 120 | 240 | 210 | 170 | 80 | 250 |

*1 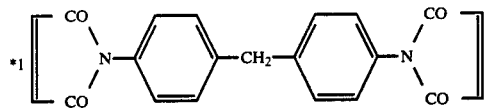   *2 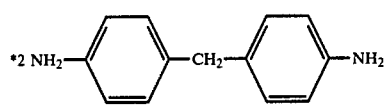

In Examples 1 to 6, and in Comparative Examples 2, 4, 5, each set of ingredients except for N,N'-methylene-bis(N-phenyl-maleimide) to be placed later was placed in a 3 liter 4-port flask in respective amounts expressed by weight (g) in Table 1. After incorporating a stirrer, thermometer, and cooling device into the flask, nitrogen was fed through the side port into the flask to displace the atmosphere in flask therewith. Then, the mixture of the above ingredients was heated in an oil bath to a temperature listed in the Table 1 while being stirred upon the commencement of dissolving. After stirring for a time period listed in Table 1, the resulting solution was heated to a temperature of 95° C. in 10 minutes, at which condition N,N'-methylene-bis(N-phenyl-maleimide) in the listed amount in Table 1 was placed into the flask and dissolved in the mixture in about 10 minutes. The resulting mixture was then cooled to give a prepolymer solution.

In Comparative Examples 1 and 3, each set of ingredients in the amounts listed in Table 1 was mixed and processed in the same condition as in the above but without the later addition of N,N'-methylene-bis(N-phenyl-maleimide) so as to prepare a prepolymer solution.

The prepolymer solutions prepared in accordance with the above Examples 1 to 6 and Comparative Examples 1 to 5 show respective analytically determined values indicative of their component proportions as well as other specific properties, as listed in Table 2.

It is apparent from the results shown in Tables 1 and 2 that Comparative Examples 1 to 5 fail to prepare the prepolymer solution of advantageous component proportions specific to the present invention, the reasons of which are thought to result from the improper combination of the reaction temperature and time. It is also noted that the prepolymer solutions prepared in accordance with Examples 1 to 6 were observed to be clear liquid substantially free of precipitation of unreacted components or undissolved macromolecular compounds.

TABLE 2

| | Example No. | | | | | | Comparative Example No. | | | | |
|---|---|---|---|---|---|---|---|---|---|---|---|
| | 1 | 2 | 3 | 4 | 5 | 6 | 1 | 2 | 3 | 4 | 5 |
| Determined Proportions (%) within resin content*1 | | | | | | | | | | | |
| Unreacted Reactants | 48.4 | 51.6 | 54.1 | 41.6 | 54.7 | 50.3 | 38.0 | 40.0 | 39.5 | 58.4 | 43.2 |
| Compounds with molecular weight of 400 to 15000 | 47.6 | 43.1 | 40.4 | 51.8 | 39.4 | 46.4 | 56.5 | 53.3 | 55.5 | 39.3 | 49.3 |
| Compounds with molecular weight above 15000 | 4.0 | 5.3 | 5.5 | 6.6 | 5.9 | 3.3 | 5.5 | 6.7 | 5.0 | 2.3 | 7.5 |
| Gelation time (minutes) at 170° C. | 12.7 | 13.0 | 14.2 | 11.8 | 14.8 | 13.1 | 9.0 | 9.3 | 9.8 | 16.4 | 8.7 |
| Stability*2 | | | | | | | | | | | |
| at 20° C. | O | O | O | O | O | O | O | O | O | X | O |
| at −5° C. | O | O | O | O | O | O | O | O | O | X | O |

*1 the ratio of peak areas obtained from the GPC chromatogram as explained hereinbefore.
*2 means the stability when the respective prepolymer solutions were allowed to stand at the listed temperatures and judged based upon whether turbidity appears in the solution; symbols in the table indicates as follows:
O = stable over 7 days and more;
X = turbidity appeared within 1 day (incapable of uniformly impregnating the substrate with the corresponding prepolymer solution.

Next, the prepregs obtainable by the use of the above prepolymer solutions will be discussed with reference to Table 3.

A sheet of surface finished glass cloth having a specific weight of 105 g/m² was impregnated with each of the prepolymer solutions of the above Examples 1 to 6 and Comparative Examples 1 to 3, 5 and 6. Each of the resulting resin impregnated glass cloth was thereafter partially cured in a drying oven in such a manner as to give a prepreg with a resin content of 47 to 50%. The specific properties to each of the prepregs thus prepared are listed in Table 3, from which it is found that the prepreg of the invention having the specific component proportion can not prepared with the use of the prepolymer of the Comparative Examples. It is also found from Comparative Examples 11 and 12 that the prepregs even made from the prepolymers of the present invention suffer either an increased amount (1.13%) of volatile content which was evaporated in further heating process at 180° C. for 20 minutes and is therefore thought to be included in the prepreg itself, or an shortened gelation time (150 sec.) indicative of the working time, when deviating from the specific component proportion assigned to the prepreg of the present invention. layer of the copper foil from the rest of the laminate by a perpendicular pull applied to the surface of the layer,

TABLE 3

| | Example No. | | | | | | Comparative Example No. | | | | | |
|---|---|---|---|---|---|---|---|---|---|---|---|---|
| | 7 | 8 | 9 | 10 | 11 | 12 | 7 | 8 | 9 | 10 | 11 | 12 |
| Conditions: | | | | | | | | | | | | |
| Prepolymer solution used (Example No. in Table 1) | E-1 | E-2 | E-3 | E-4 | E-5 | E-6 | C-1 | C-2 | C-3 | C-5 | E-1 | E-1 |
| Temperature (°C.) | 140 | 150 | 150 | 150 | 130 | 155 | 150 | 155 | 150 | 150 | 120 | 170 |
| Determined Proportions (%) within resin content[*1] | | | | | | | | | | | | |
| Unreacted Reactants | 31.2 | 34.1 | 29.6 | 32.9 | 33.7 | 32.1 | 26.2 | 36.3 | 30.1 | 36.7 | 38.2 | 25.9 |
| Compounds with molecular weight of 400 to 15000 | 60.1 | 57.7 | 57.7 | 55.2 | 54.9 | 58.1 | 64.7 | 55.3 | 54.9 | 50.1 | 54.3 | 56.9 |
| Compounds with molecular weight above 15000 | 8.7 | 8.2 | 12.7 | 11.9 | 11.4 | 9.8 | 9.1 | 8.4 | 15.0 | 13.2 | 7.5 | 17.2 |
| Gelation time (seconds) at 170° C. | 390 | 420 | 330 | 350 | 400 | 380 | 350 | 480 | 310 | 400 | 550 | 150 |
| Volatile content (180° C., 20 minutes) | 0.42 | 0.47 | 0.30 | 0.44 | 0.35 | 0.37 | 0.60 | 1.38 | 0.78 | 0.93 | 1.13 | 0.25 |

[*1] the ratio of peak areas obtained from the GPC chromatogram as explained hereinbefore;
E-1 to E-6 correspond to Examples 1 to 6 as listed in Tables 1 and 2;
C-1 to C-3, C-5 and C-6 correspond to Comparative Examples 1 to 3, 5 and 6, respectively as listed in Tables 1 and 2

The discussion of laminate products obtained from the above prepregs will be made herein. With respect to each of the prepregs of Examples 7 to 12 and Comparative Examples 7 to 12 listed in Table 3, 4 sheets of 30 cm × 30 cm square prepregs of the same kinds were stacked together with surface treated copper foils of 0.5 oz./ft$^2$ to form a core with the copper foils on the opposite faces. The core was then placed between a pair of 1.6 mm thick planishing plates to be cured at an pressure of 5 kg/cm$^2$ (initial pressing stage) and temperature of 130° C. for 20 minutes. Subsequently, it was heated to a temperature of 170° C. as being held between the same plates and pressed at a pressure of 10 kg/cm$^2$ (second pressing stage) for 90 minutes. Thereafter, it was cooled to a room temperate as being pressed between the plates to present a double-sided laminate with copper foils on both sides thereof. The resulting laminate was subjected to an after-cure treatment at a temperature of 200° C. for 120 minutes. Water absorption (%) with respect to each of the laminates thus fabricated was measured in accordance with the testing method of copper-clad laminates for printed circuits prescribed as JIS (Japanese Industrial Standard) C 6481, the measuring results are listed in Table 4.

Also with respect to each of the prepregs of Examples 7 to 12 and Comparative Examples 7 to 12 listed in Table 3, 5 sheets of 50 cm × 50 cm square prepregs of the same kinds were stacked together with surface treated copper foils of 0.5 oz./ft$^2$ to form a core with the copper foils on the opposite faces. Each core was processed in the same condition as in the above manner to give a double-sided laminate with the copper foils. Also in the like manner, each core was processed in the same condition as in the above except it was pressed in the second pressing stage at a pressure of 15 kg/cm$^2$ so as to give another double-sided laminate with the copper foils. The laminates thus obtained were then tested with regard to to a bond strength or adhesive property, which is a measure of the force required to separate a the results of which are listed in Table 4.

Also included in Table 4 are dimension variance measured for each of laminates prepared respectively from the prepregs of Examples 7 to 12 and Comparative Examples 7 to 12. A sheet of 25 cm × 25 cm square prepreg obtained from each of the prepregs listed in Table 4 was furnished on each side thereof with an 1 oz/ft$^2$ copper foil of identical planar dimension and was processed under the same condition as in the above to provide a first laminate with the copper foil layers on both sides thereof. At this condition, index holes were drilled in each first laminate at a spacing of about 200 mm along one dimension thereof and exact measurement was recorded with respect to the spacing between the index holes. Subsequently, the copper foils on both sides of the first laminate were removed by known etching technique, and 2 sheets of prepregs of identical kind and dimension were added to each surface of the first laminate with a 1 oz/ft$^2$ copper foil of identical dimension added over the newly added prepregs on each surface. The resulting laminate was molded at a pressure of 10 kg/cm$^2$ and a temperature of 170° C. for 90 minutes followed by being subjected to after-cure treatment at a temperature of 200° C. for 120 minutes so as to give a final laminate product with the copper foil layers on both sides thereof. Then, the external layer of copper foil was mechanically removed at portions corresponding to said index holes in the inner or first laminate for the purpose of measuring again the exact spacing between the index holes after the complete molding of the laminate product. The measuring result with respect to each of the final products obtained was compared with the corresponding measurement record obtained previously with respect to the first laminate for judging the dimensional variance of the product between before and after incorporating additional prepreg layers, the measuring results of which are listed in Table 4.

TABLE 4

| | Example No. | | | | | | Comparative Example No. | | | | | |
|---|---|---|---|---|---|---|---|---|---|---|---|---|
| | 13 | 14 | 15 | 16 | 17 | 18 | 14 | 15 | 16 | 17 | 18 | 19 |
| Prepreg used (Example No. in Table 3) | E-7 | E-8 | E-9 (Example No. in Table 3) | E-10 | E-11 | E-12 | C-7 | C-8 | C-9 (Comparative Example No. in Table 3) | C-10 | C-11 | C-12 |
| Moldability at 15 kg/cm$^2$[*1] [2nd pressing stage] | O | O | O | O | O | O | O | O | O | O | O | X |

TABLE 4-continued

| | Example No. | | | | | | Comparative Example No. | | | | | |
|---|---|---|---|---|---|---|---|---|---|---|---|---|
| | 13 | 14 | 15 | 16 | 17 | 18 | 14 | 15 | 16 | 17 | 18 | 19 |
| Moldability at 10 kg/cm²*¹ [2nd pressing stage] | O | O | O | O | O | O | X | O | X | O | O | — |
| Dimensional variance (%) | 0.015 | 0.015 | 0.015 | 0.015 | 0.015 | 0.015 | — | 0.025 | — | 0.020 | 0.020 | — |
| Water absorption (JIS C 6481) | 0.77 | 0.81 | 0.70 | 0.78 | 0.73 | 0.75 | — | 1.48 | — | 1.03 | 1.26 | — |
| Bond Strength (kg/cm²)*² | 1.51 | 1.50 | 1.44 | 1.48 | 1.46 | 1.52 | 1.36 | 1.28 | 1.23 | 1.10 | 1.30 | — |

*¹symbol O indicates that no void nor other surface defection was observed; and symbol X indicates that the same was observed. (observed after removing exposed copper foils from both sides of sample)
*²molded at 15 kg/cm² in 2nd pressing stage.

From Table 4, it is found that Examples 13 to 18, which utilized the prepreg of the invention and molded at a low pressure, have a greater bond strength than the Comparative Examples 14 to 19, in addition to exhibit less water absorption and less dimensional variance, which certainly meets the requirements of the multilayer printed boards such as improved electrical characteristics and dimensional stability. Further, the laminates of Examples 13 to 18 have a peel strength (bond strength) as much as 1.4 kg/cm² or more, which is quite satisfactory for the printed circuit board.

It is also noted at this point that although the polyimide prepolymer composition of the invention is particularly suitable for fabrication of the laminate products, it can be of course utilized as molding material in extensive fields of electrical application, for example, the prepolymer when combined with suitable fillers can serve to seal semiconductors, to form the supports of high mechanical strength and superior elasticity for electrical modules, to adhere chips on their mounting base, and to prepare paste for circuit forming. With the employment of the prepolymer of the present invention, the products obtainable therefrom can be endowed with remarkable resistance to heat and high bond strength in addition to good elastic property.

What is claimed is:

1. A polyimide prepolymer composition of addition reaction obtained by reacting an unsaturated bisimide with a diamine; said composition consisting essentially of 41-55% of unreacted reactants, 39-54% of components having a molecular weight of between 400 and 15,000, and 3.0-6.8% of components having a molecular weight of more than 15,000 and wherein the molecular weight is measured by Gel Permeation Chromatography Analysis.

2. A polyimide prepolymer as set forth in claim 1, wherein the molar ratio of the unsaturated bisimide remaining unreacted to the diamine remaining unreacted is between 1.7 to 2.5.

3. A prepreg produced by the following steps of:
reacting an unsaturated bisimide with a diamine so as to prepare a polyimide prepolymer composition of addition reaction consisting essentially of 41-55% of unreacted reactants, 39-54% of components having a molecular weight of between 400 and 15,000, and 3.0-6.8% of components having a molecular weight of more than 15,000 with the molecular weight measured by Gel Permeation Chromatography Analysis;
dissolving the resulting prepolymer composition in a solvent to form a solution;
impregnating a suitable substrate with the solution to prepare resin impregnated substrate; and
partially curing the resin impregnated substrate to such an extent that resin content thereof consists essentially of 29-35% of unreacted reactants, 51-65% of the components having a molecular weight of between 400 and 15,000, and 5-14% of the components having a molecular weight of more than 15,000.

* * * * *